(12) United States Patent
Zang et al.

(10) Patent No.: US 11,462,579 B2
(45) Date of Patent: Oct. 4, 2022

(54) PIXEL AND ASSOCIATED TRANSFER-GATE FABRICATION METHOD

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 169 days.

(21) Appl. No.: 16/804,671

(22) Filed: Feb. 28, 2020

(65) Prior Publication Data
US 2021/0272994 A1 Sep. 2, 2021

(51) Int. Cl.
*H01L 27/146* (2006.01)
*H01L 29/423* (2006.01)

(52) U.S. Cl.
CPC .... *H01L 27/14614* (2013.01); *H01L 27/1461* (2013.01); *H01L 27/14643* (2013.01); *H01L 27/14689* (2013.01); *H01L 29/4236* (2013.01)

(58) Field of Classification Search
CPC .......... H01L 27/14614; H01L 27/1461; H01L 27/14643; H01L 27/14689; H01L 27/1464; H01L 27/14601; H01L 27/14603; H01L 27/14605; H01L 27/14632; H01L 27/14683; H01L 29/4236
See application file for complete search history.

(56) References Cited

U.S. PATENT DOCUMENTS

| 10,475,744 B2* | 11/2019 | Chen ..................... H01L 21/764 |
| 2012/0138886 A1* | 6/2012 | Kuhn .................... H01L 29/165 |
| | | 438/479 |
| 2021/0098515 A1* | 4/2021 | Ezaki ..................... H01L 31/02 |

FOREIGN PATENT DOCUMENTS

WO WO-2015174296 A1 * 11/2015 ....... H01L 27/14612

* cited by examiner

*Primary Examiner* — Nilufa Rahim
(74) *Attorney, Agent, or Firm* — Lathrop GPM LLP

(57) ABSTRACT

A method for forming a transfer gate includes (i) forming a dielectric pillar on a surface of a semiconductor substrate and (ii) growing an epitaxial layer on the semiconductor substrate and surrounding the dielectric pillar. The dielectric pillar has a pillar height that exceeds an epitaxial-layer height of the epitaxial layer relative to the surface. The method also includes removing the dielectric pillar to yield a trench in the epitaxial layer. A pixel includes a doped semiconductor substrate having a front surface opposite a back surface. The front surface forms a trench extending a depth $z_T$ with respect to the front surface within the doped semiconductor substrate along a direction z perpendicular to the front surface and the back surface. The pixel has a dopant concentration profile, a derivative thereof with respect to direction z being discontinuous at depth $z_T$.

14 Claims, 5 Drawing Sheets

PIXEL AND ASSOCIATED TRANSFER-GATE FABRICATION METHOD

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed as a plurality of infinitesimally small point-sources of illumination—"impulses"—incident on the camera. The lens images each of the plurality of impulses at a plane of the pixel array as a respective one of a plurality of point-spread functions— "impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode region, a floating diffusion region, and a transfer gate. The transfer gate controls current flow from the photodiode region to the floating diffusion region and may be part of a field-effect transistor. The electric potential of the photodiode region exceeds that of the floating diffusion region. Light reaching the photodiode region generates photoelectrons. Turning on the transfer gate forms a conducting channel that allows the accumulated photoelectrons to transfer or flow from the photodiode region to the floating diffusion region. When the transfer gate is pulsed to an off-state, the potential barrier is higher than that of the photodiode region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally orientated with respect to the vertical direction perpendicular thereto that defines the direction of normally-incident light (illumination) reaching the pixel array. Such a horizontal orientation limits how much the pixel density can be increased. Hence, one way to increase pixel density is to orient the photodiode, transfer gate, and floating diffusion in a direction that has a vertical component. Such transfer gates are examples of vertical transfer gates.

SUMMARY OF THE EMBODIMENTS

While vertical transfer gates enable increased pixel density, fabricating pixels with vertical transfer gates involves complicated processing. The gate electrode material of the vertical transfer gate is in a trench that must extend to a depth of approximately 0.4 micrometers from a top surface of the pixel's semiconductor substrate. This distance makes it challenging to form a sufficiently deep photodiode region via ion implantation from the top surface. When the trench is formed via reactive ion etching (RIE) or reactive ion sputtering (RIS), surface features of its sidewalls and bottom surface contribute to electron transport lag and dark current, which result in image artifacts such as black dots and white pixels. Embodiments disclosed herein ameliorate these problems.

In a first aspect, a method for forming a transfer gate includes (i) forming a dielectric pillar on a surface of a semiconductor substrate and (ii) growing an epitaxial layer on the semiconductor substrate and surrounding the dielectric pillar. The dielectric pillar has a pillar height that exceeds an epitaxial-layer height of the epitaxial layer relative to the surface. The method also includes removing the dielectric pillar to yield a trench in the epitaxial layer.

Forming the trench according to this method, rather than via RIE or RIS, yields a trench that lacks the aforementioned surface features that result in image artifacts. An additional advantage to this method is that thickness of the epitaxial layer determines the depth of the trench. Since epitaxial growth can yield layers that meet tight thickness tolerances, the depth of the trench can also meet said tolerances.

In a second aspect, a pixel includes a doped semiconductor substrate. The doped semiconductor substrate has a front surface opposite a back surface. The front surface forms a trench extending a depth $z_T$ with respect to the front surface within the doped semiconductor substrate along a direction z perpendicular to the front surface and the back surface. The pixel has a dopant concentration profile, a derivative of the dopant concentration profile with respect to the direction z being discontinuous at depth $z_T$.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
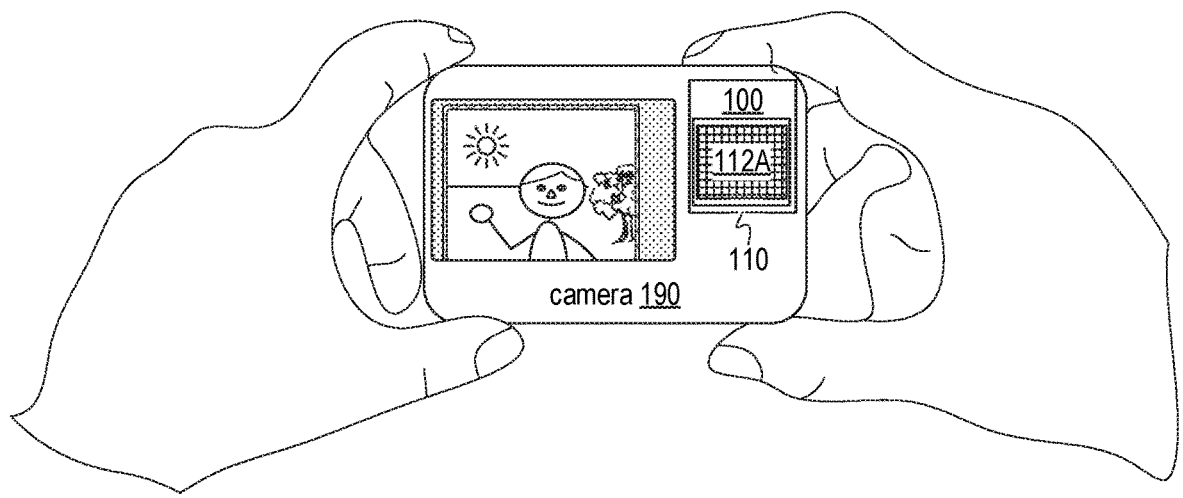
FIG. 1 depicts a camera imaging a scene.

FIG. 1 depicts a camera 190 imaging a scene. Camera 190 includes an image sensor 100, which includes a semiconductor substrate 110. Constituent elements of semiconductor substrate 110 may include at least one of silicon and germanium. Semiconductor substrate 110 includes a pixel array 112A. Image sensor 100 may part of a chip-scale package or a chip-on-board package.

Figure 2:
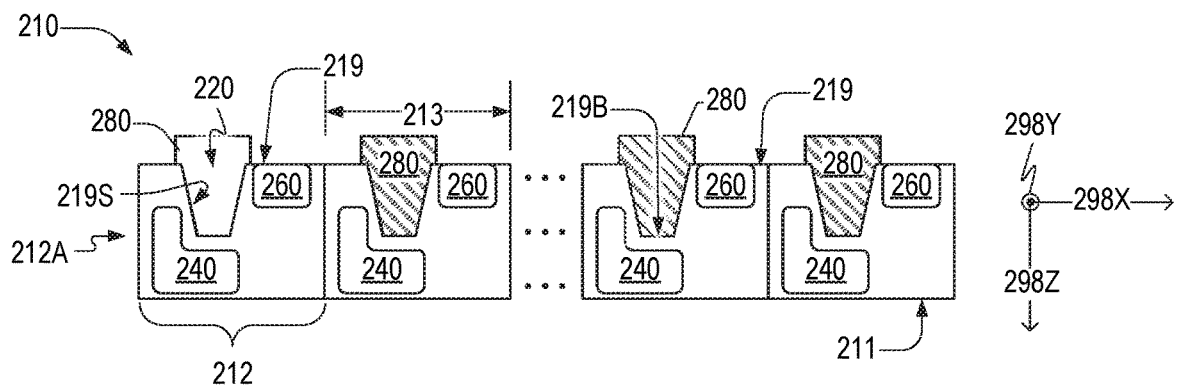
FIG. 2 is a cross-sectional schematic of a semiconductor substrate, which is an embodiment of the semiconductor substrate of the camera of FIG. 1.

FIG. 2 is a cross-sectional schematic of a semiconductor substrate 210, which is an example of semiconductor substrate 110 of image sensor 100. The cross-section illustrated in FIG. 2 is parallel to a plane, hereinafter the x-z plane, formed by orthogonal directions 298X and 298Z, which are each orthogonal to direction 298Y. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto. Herein, a reference to an axis x, y, or z or associated direction ±x, ±y, or ±z refers to directions 298X, 298Y, and 298Z respectively. Also, herein, a horizontal plane is parallel to the x-y plane, a width refers to an object's extension in the y direction, and vertical refers to the z direction.

Semiconductor substrate 210 has a bottom substrate surface 211 and a top substrate surface 219, each of which may be perpendicular to direction 298Z. Herein, top substrate surface 219 may be referred to as the front side surface of semiconductor substrate 210 and bottom substrate surface 211 may be referred to as the backside surface of semiconductor substrate 210. Herein, top substrate surface 219 may be referred as the non-illuminated surface of semiconductor substrate 210 and bottom substrate surface 211 opposite to top substrate surface 219 may be referred to as the illuminated surface of semiconductor substrate 210. Semiconductor substrate 210 includes a plurality of pixels 212 that form a pixel array 212A, which is an example of pixel array 112A. Pixels 212 are arranged in a plurality of rows and columns in directions 298X and 298Y respectively. Pixel array 212A has a pixel pitch 213 in direction 298X. In direction 298Y pixel array 212A has pitch $P_y$, that, in embodiments, equals pixel pitch 213. In embodiments, pixel pitch 213 is less than 1.1 µm, for example, pixel pitch 213 may equal 0.9 µm.

Figure 3:
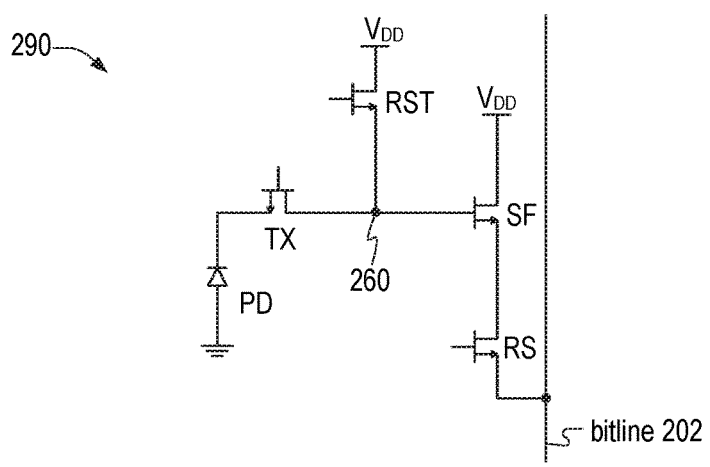
FIG. 3 is a circuit diagram of a four-transistor ("4T") pixel, which is a candidate pixel circuitry architecture of a pixel of FIG. 2.

FIG. 3 is a circuit diagram of a four-transistor ("4T") pixel 290, which is a candidate pixel circuitry architecture of pixel 212. Pixel 290 includes a photodiode PD, a transfer transistor TX, a reset transistor RST, a source follower transistor SF, a row-select transistor RS. Pixel 290 is electrically connected to a bitline 202 of image sensor 100. FIGS. 2 and 3 are best viewed together in the following description.

Each pixel 212 includes a respective photodiode region 240 of a respective photodiode PD, a vertical transfer gate 280 of a respective transfer transistor (e.g., transfer transistor TX), and a respective floating diffusion region 260. Photodiode region 240 of each pixel 212 is at least partially buried in the semiconductor substrate 210 and is configured to generate and accumulate charges in response to incident light (illumination) thereon, for example entered from bottom substrate surface 211 of semiconductor substrate 210 (e.g., backside surface of semiconductor substrate 210) during an integration period of the image sensor 100. Electrical connection of photodiode region 240 to floating diffusion region 260 depends on voltage applied to vertical transfer gate 280. Charges, e.g., photoelectrons, accumulated in photodiode region 240 (e.g., source of transfer transistor TX), for example during an integration period of image sensor 100, can be selectively transferred to floating diffusion region 260 (e.g., drain of transfer transistor TX) depending on voltage applied to vertical transfer gate 280 of the transfer transistor (e.g., transfer transistor TX) associated with pixel 212, for example during a subsequent charge transfer period. The photodiode region 240 may be in form of various configurations including pinned photodiode configuration, partially pinned photodiode configuration.

Each vertical transfer gate 280 of the transfer transistor (e.g., vertical gate portion of transfer transistor TX) is formed in a respective trench 220 formed by top substrate surface 219. Trench 220 includes side surfaces 219S and a bottom surface 219B.

In embodiments, each pixel 212 is a four-transistor pixel or 4T pixel and further includes a reset transistor RST, a source follower transistor SF, and a row-select transistor RS. The reset transistor RST is coupled between a power line and the floating diffusion region 260 to reset (e.g., discharge or charge floating diffusion region 260 to a preset voltage e.g., a supply voltage $V_{DD}$) under control of a reset signal during a reset period. The reset transistor RST is further coupled to photodiode region 240 of photodiode PD through the transfer transistor TX to selective reset photodiode region 240 to the preset voltage during the reset period. Floating diffusion region 260 is coupled to a gate of the source follower transistor SF. The source follower transistor SF is coupled between the power line and the row-select transistor RS. The source follower transistor SF operates to modulate the image signal output based on the voltage of floating diffusion region 260 received, where the image signal corresponds to the amount photoelectrons accumulated in photodiode region 240 during the integration period at the gate thereof. The row-select transistor RS selectively couples the output (e.g., image signal) of the source follower transistor RS to the readout column line (for example, bitline 202) under control of a row select signal.

In operation, during the integration period (also referred to as an exposure or accumulation period) of image sensor 100, photodiode region 240 of photodiode PD detects or absorbs light incident on pixel 212 and photogenerates charge. During the integration period, the transfer transistor TX is turned off, i.e., the vertical transfer gate 280 of the transfer transistor TX receives a cut-off signal (e.g., a negative biasing voltage). The photogenerated charge accumulated in photodiode region 240 is indicative of the amount of light incident on photodiode region 240 of photodiode PD. After the integration period, the transfer transistor TX forms a conduction channel along the vertical transfer gate structure formed near the photodiode region 240 and transfers the photogenerated charge to floating diffusion region 260 through the conduction channel upon reception of a transfer signal (e.g., a positive biasing voltage) at vertical transfer gate 280. The source follower transistor SF generates the image signal. The row-select transistor RS coupled to the source follower transistor then selectively reads out the signal onto a column bit line for subsequent image processing.

The disclosed vertical transfer gate structure may apply to any of a variety of additional or alternative types of pixel cell, e.g. a five-transistor pixel cell, or a six-transistor pixel cell and/or the like.

Figure 4:
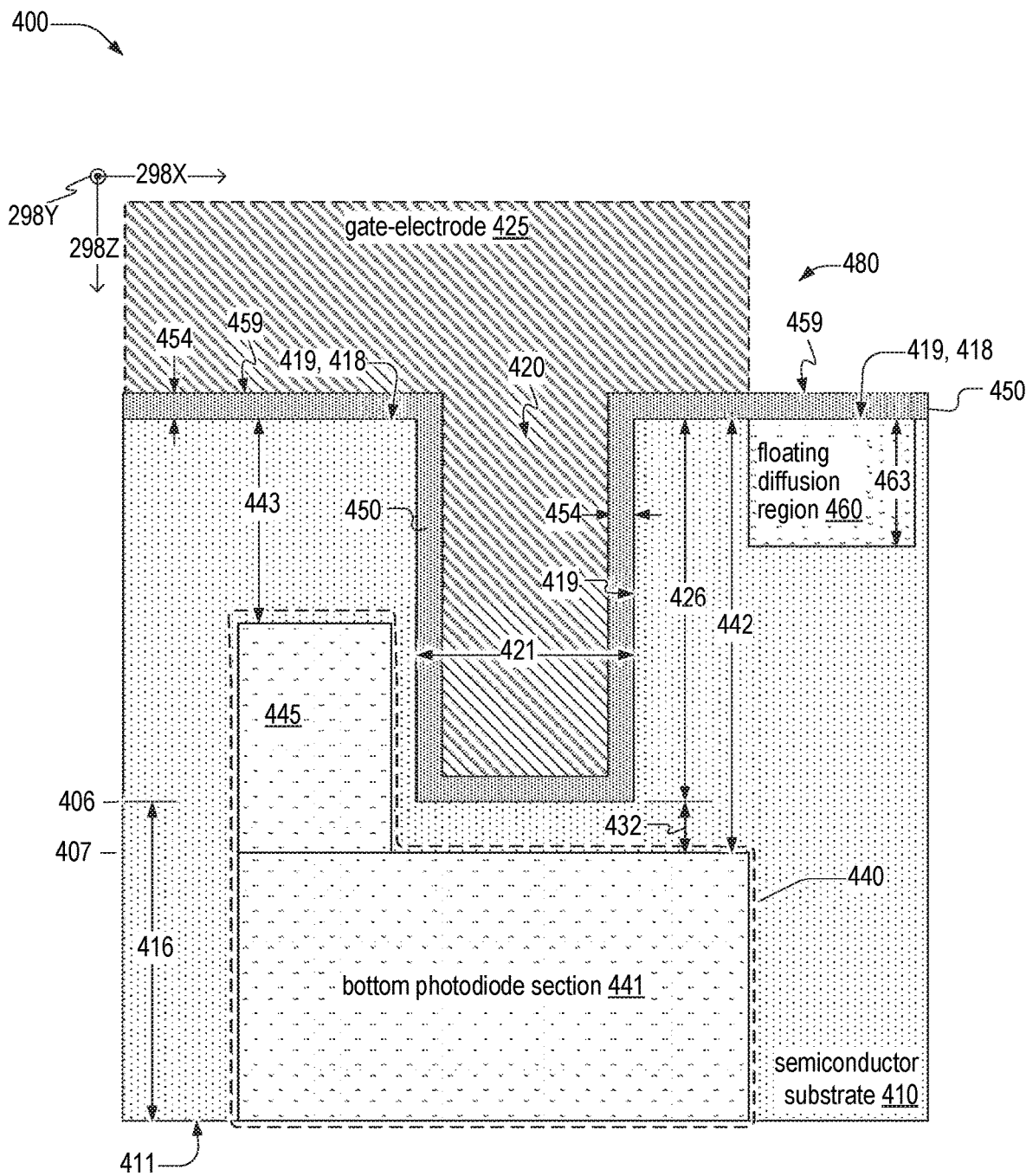
FIG. 4 is a cross-sectional schematic of a pixel, which is an example of a pixel formed in the semiconductor substrate of FIG. 2, in an embodiment.

FIG. 4 is a cross-sectional schematic of a pixel 400, which is an example of pixel 212. Pixel 400 is formed in a semiconductor substrate 410, which is an example of semiconductor substrate 210, FIG. 2. Pixel 400 includes a trench 420 and a photodiode region 440 formed in semiconductor substrate 410. In embodiments, pixel 400 includes at least one of a floating diffusion region 460, a gate-electrode 425, and a dielectric layer 450 (e.g., a gate oxide layer). Dielectric layer 450 has a thickness 454 and may include at least one of a nitride material and an oxide material. In embodiments, thickness 454 is between two nanometers and ten nanometers. Materials that constitute gate-electrode 425 may include at least one of polysilicon, a metal, and other conductive materials. Trench 420, dielectric layer 450, and gate-electrode 425 collectively form a vertical transfer gate 480 of a transfer transistor of pixel 400. Vertical transfer gate 480 is electrically connected to photodiode region 440, and is an example of vertical transfer gate 280, FIG. 2.

Semiconductor substrate 410 has a surface 419 that forms trench 420. Surface 419 includes a planar region 418 surrounding trench 420. Trench 420 extends into semiconductor substrate 410 to a trench depth 426 relative to planar region 418. Surface 419 is an example of top substrate surface 219. FIG. 4 denotes a transverse plane 406 at trench depth 426 with respect to planar region 418.

In embodiments, trench depth 426 is between 0.1 and 0.9 micrometers. In at least one of directions 298X and 298Y, trench 420 has a width 421, which may be between fifty nanometers and 0.3 micrometers. In embodiments, trench 420 has a non-uniform width between planar region 418 and its bottom at trench depth 426. Accordingly, width 421 may be a width of trench 420 at a depth equal to about one-half of trench depth 426. In embodiments, trench 420 has a uniform width between planar region 418 and its bottom at trench depth 426. Semiconductor substrate 410 has a bottom substrate surface 411, which is an example of bottom substrate surface 211, FIG. 2.

Photodiode region 440 is an example of photodiode region 240, FIG. 2, and includes a bottom photodiode section 441 beneath trench 420 and a top photodiode section 445 adjacent to trench 420. Bottom photodiode section 441 is formed at a photodiode depth 442 with respect to planar region 418. Bottom photodiode section 441 adjoins top photodiode section 445 at horizontal plane 407 and extends away from planar region 418 toward bottom substrate surface 411. Horizontal plane 407 is perpendicular to direction 298Z. Top photodiode section 445 is formed at a photodiode depth 443, with respect to planar region 418, that is less than the trench depth 426 and extends toward bottom substrate surface 411 to a horizontal plane 407. Depth 442 exceeds trench depth 426 by a depth 432, which in embodiments is between thirty nanometers and three-hundred nanometers.

In embodiments, semiconductor substrate 410 is p-doped, photodiode region 440 is n-doped, and floating diffusion region 460 is n⁺-doped. In embodiments, floating diffusion region 460 has a dopant concentration between $10^{19}$ and $5 \times 10^{20}$ charge carriers per cubic centimeter. Floating diffusion region 460 is formed at a junction depth 463 with, respect to planar region 418, which is less than trench depth 426 and photodiode depth 443. Dielectric layer 450 is disposed on planar region 418 and in trench 420 lining sidewalls of trench 420. Dielectric layer 450 has a top surface 459. In embodiments, part of gate-electrode 425 is disposed on top surface 459 such that photocurrent from photodiode region 440 can reach floating diffusion region 460.

Semiconductor substrate 410 has a bottom substrate surface (or bottom surface 411) opposite top substrate surface (or top surface) 419. Transverse plane 406 and bottom substrate surface 411 are separated by a distance 416, which in embodiments is between 2.0 micrometers and 3.5 micrometers. In embodiments, pixel 400 operates in image sensor 100 as one of a plurality of back-side illuminated pixels of pixel array 112A that face an imaging lens of camera 190, FIG. 1. Light transmitted through the imaging lens is incident on bottom surface 411. Efficient detection of this light depends on the proximity of photodiode section 441 to bottom surface 411, and hence also on implanting ions deep into semiconductor substrate with respect to top surface 419.

Figure 5:
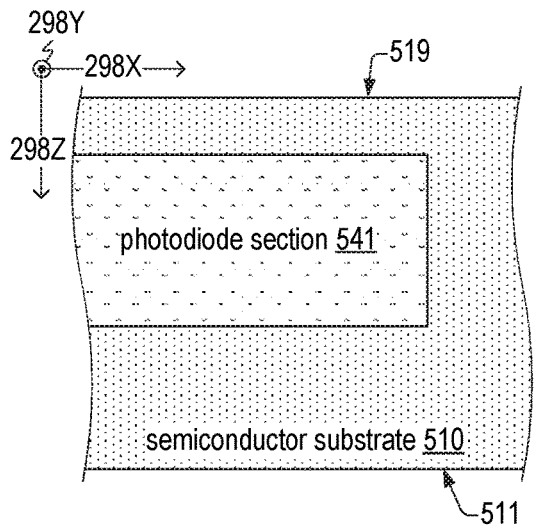
FIG. 5 is a cross-sectional schematic of a semiconductor substrate that includes a photodiode section implanted therein, in an embodiment.

FIG. 5 is a cross-sectional schematic of a semiconductor substrate 510 that includes a photodiode section 541 implanted therein. Semiconductor substrate 510 and photodiode section 541 are respective examples of semiconductor substrate 410 and photodiode section 441, respectively. Semiconductor substrate 510 has a bottom substrate surface 511 and a top substrate surface 519, which are respective examples of top and bottom substrate surfaces 411 and 419 of semiconductor substrate 410.

In embodiments, at least part of semiconductor substrate 510 is an epitaxial substrate, that is, a layer or substrate formed via an epitaxial process. For example, top surface 519 may be a top surface of an epitaxial layer; bottom surface 511 may be the bottom surface of the epitaxial layer. An advantage of top surface 519 being a top surface of an epitaxial layer is the facilitation of the formation of an epitaxial layer thereon, as described regarding FIG. 8.

Figure 6:
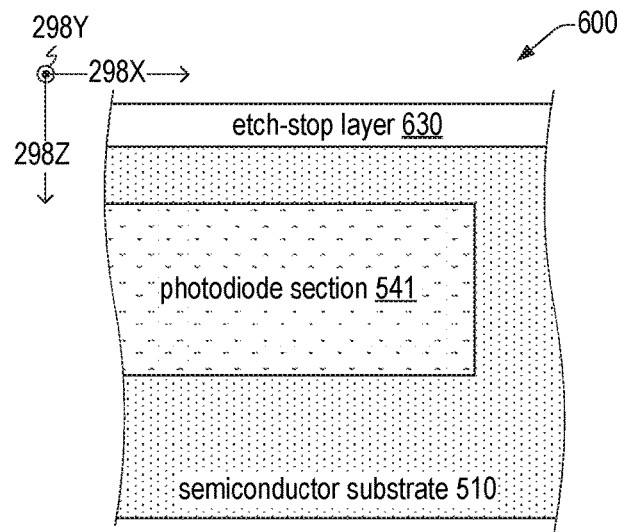
FIG. 6 is a cross-sectional schematic of the semiconductor substrate of FIG. 5 after deposition of an etch-stop layer thereon, in an embodiment.

FIG. 6 is a cross-sectional schematic of a coated substrate 600, which is semiconductor substrate 510 after deposition of an etch-stop layer 630 thereon. In embodiments, etch-stop layer 630 is formed of a high-κ dielectric material and/or an oxide.

Figure 7:
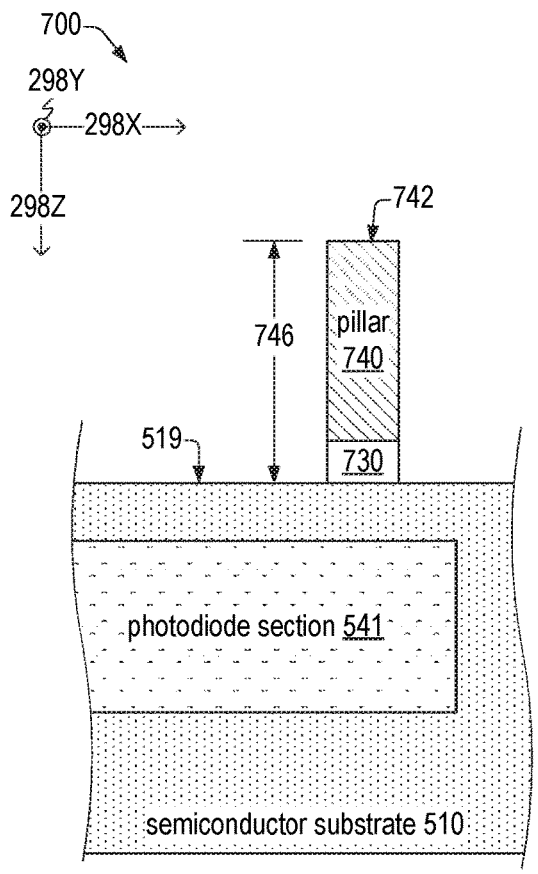
FIG. 7 is a cross-sectional schematic of a substrate assembly, which is the coated substrate of FIG. 6 after formation of a pillar on the semiconductor substrate, in an embodiment.

FIG. 7 is a cross-sectional schematic of a substrate assembly 700, which is coated substrate 600 after formation of a pillar 740 on semiconductor substrate 510. Pillar 740 has a top surface 742 located at a height 746 above top surface 519 of semiconductor substrate 510. Pillar 740 may be formed of a dielectric.

In embodiments, pillar 740 is formed by forming a dielectric layer on etch-stop layer 630 through deposition such as chemical vapor deposition process, patterning the dielectric layer with photoresist, for example by lithography process, and etching the patterned dielectric layer such that pillar 740 is the remaining part of the dielectric layer. The dielectric layer may have a thickness between 0.3 and 0.6 micrometers. In embodiments, substrate assembly 700 includes etch-stop layer 730, which is what remains of etch-stop layer 630 after etching of the dielectric layer and etch-stop layer 630.

In embodiments, a first patterning and etching process (e.g., dry or wet etching) is applied to etch the patterned dielectric layer. A second patterning and wet etching process with hydrofluoric acid (HF) etches the patterned etch stop layer 630 and clean the silicon surface of the semiconductor substrate 510 without causing damage to silicon surface. The first and second processes yield pillar 740 on etch-stop layer 730. The location of pillar 740 corresponds to the position of a vertical transfer gate (for example, vertical transfer gate 480) of a transfer transistor. The thickness or height of pillar 740 corresponds to the depth of the vertical transfer gate into the semiconductor substrate 510.

In embodiments, an etch selectivity of the dielectric forming pillar 740 exceeds that of etch-stop layer 630. Etch selectivity may by relative to semiconductor substrate 510. That is, for a given etchant, the dielectric forming pillar 740 has an etch rate that exceeds an etch rate of etch-stop layer 630, such that, in embodiments, semiconductor substrate 510 is not damaged while etching the dielectric layer to yield pillar 740. The process may include reactive ion etching.

Figure 8:
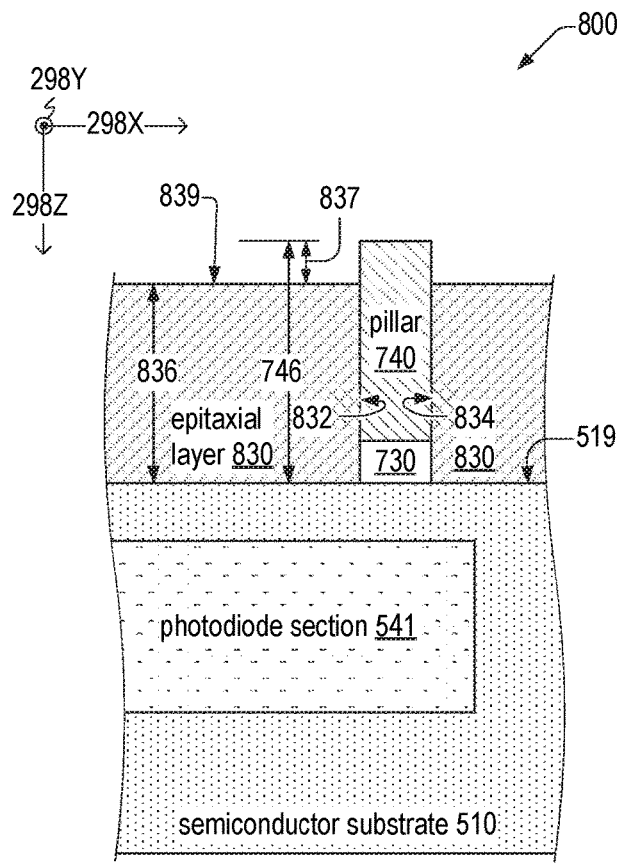
FIG. 8 is a cross-sectional schematic of the substrate assembly of FIG. 7 after epitaxial growth of an epitaxial layer on the semiconductor substrate, in an embodiment.

FIG. 8 is a cross-sectional schematic of a substrate assembly 800, which is substrate assembly 700 after epitaxial growth of an epitaxial layer 830 on semiconductor substrate 510. Epitaxial layer 830 may surround pillar 740 is transverse planes. In embodiments, epitaxial layer 830 and semiconductor substrate 510 are formed of the same material and of same conductive type, such that layer 830 is a homoepitaxial layer with respect to semiconductor substrate 510. Epitaxial layer 830 has a top surface 839 and sidewall surfaces 832 and 834, which adjoin pillar 740. Sidewall surfaces 832 and 834 may denote regions of a continuous surface on opposite sides of pillar 740.

Epitaxial layer 830 has a thickness 836 between top surfaces 519 and 839. In embodiments, thickness 836 is between 0.1 and 0.9 micrometers. For example, thickness 836 may be between 0.3 and 0.6 micrometers. Height 746 exceeds thickness 836 by a distance 837, by at least ten nanometers for example. In embodiments, distance 837 is between ten nanometers and fifty nanometers, which enables proper etching of pillar 740 to create a trench in epitaxial layer 830, as described below.

Figure 9:
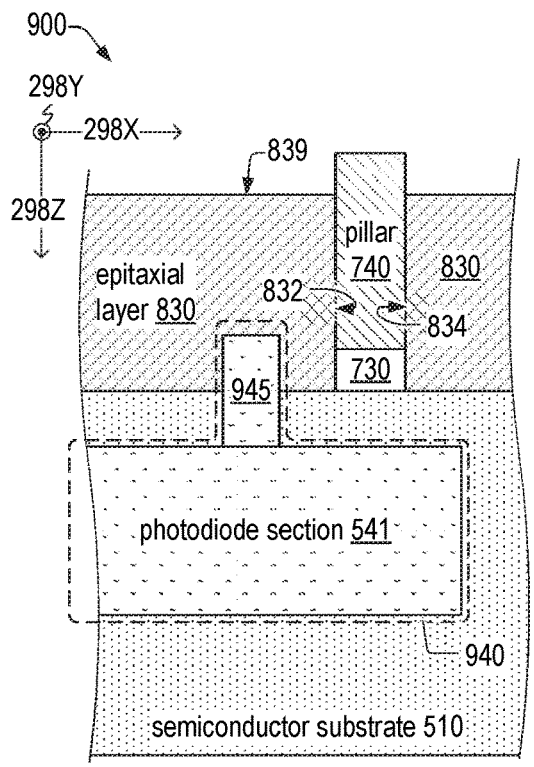
FIG. 9 is a cross-sectional schematic of the substrate assembly of FIG. 8 after implantation of a doped region in the epitaxial layer and the semiconductor substrate, in an embodiment.

FIG. 9 is a cross-sectional schematic of a substrate assembly 900, which is substrate assembly 800 after implantation of a doped region 945 in semiconductor substrate 510 and epitaxial layer 830. Doped region 945 is an example of top photodiode section 445. Doped region 945 and photodiode section 541 form a photodiode region 940, which is an example of photodiode region 440.

Figure 10:
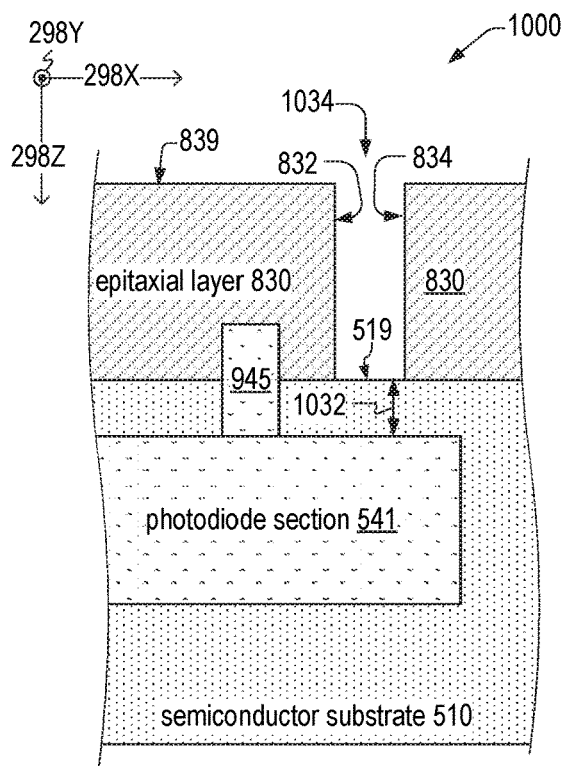
FIG. 10 is a cross-sectional schematic of the substrate assembly of FIG. 9 after removal of the pillar of FIG. 7 yields a trenched substrate assembly, in an embodiment.

FIG. 10 is a cross-sectional schematic of a trenched substrate assembly 1000, which is substrate assembly 900 after removal of pillar 740 and etch-stop layer 730. Surfaces 832, 834 and top surface 519 form a trench 1034. When substrate assembly 800 does not include etch-stop layer 730, trench 1034 has a trench depth equal to thickness 836 of epitaxial layer 830. As such, thickness 836 is an example of trench depth 426, FIG. 4.

Figure 11:
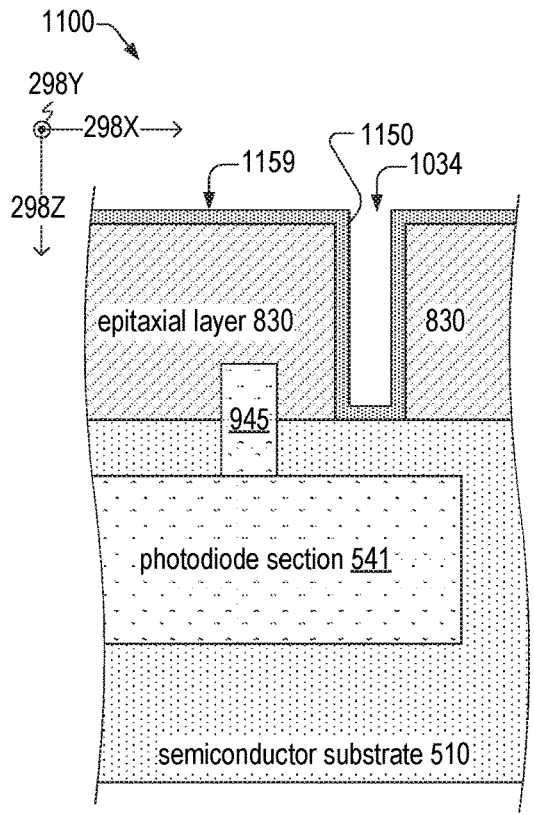
FIG. 11 is a cross-sectional schematic of the trenched substrate assembly of FIG. 10, which is the coated substrate of FIG. 10 with a dielectric layer lining the trench, in an embodiment.

FIG. 11 is a cross-sectional schematic of a trenched substrate assembly 1100, which is trenched substrate assembly 1000 after deposition of a dielectric layer 1150 on surfaces 839, 832, 834, and 519 such that dielectric layer 1150 lines trench 1034. Dielectric layer 1150 is an example of dielectric layer 450.

Figure 12:
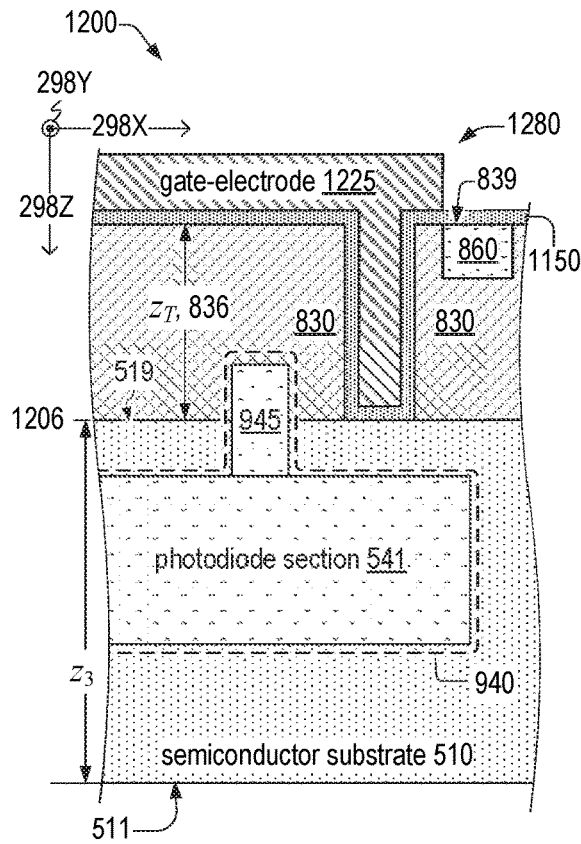
FIG. 12 is a cross-sectional schematic of a pixel, which is the trenched substrate assembly of FIG. 11 after the trench is filled with a gate-electrode, in an embodiment.

FIG. 12 is a cross-sectional schematic of a pixel 1200, which is trenched substrate assembly 1100 after trench 1034 is filled with gate-electrode 1225, which is an example of gate-electrode 425. Pixel 1200 is an example of pixel 400. Trench 1034, dielectric layer 1150, and gate-electrode 1225 collectively form a vertical transfer gate 1280 of a transfer transistor of pixel 1200. Vertical transfer gate 1280 is electrically connected to photodiode region 440, and is an example of vertical transfer gate 480, FIG. 4. Dielectric layer 1150 has a top surface 1159.

Epitaxial layer 830 may include a floating diffusion region 860, which is an example of floating diffusion region 460, FIG. 4. In embodiments, part of gate-electrode 1225 is disposed on top surface 1159 such that photocurrent from photodiode region 940 can reach floating diffusion region 860.

FIG. 12 denotes a plane 1206 located at a depth $z_T$ beneath top surface 839, where depth $z_T$ equals thickness 836. FIG. 12 denotes a distance $z_3$ between plane 1206 and bottom substrate surface 511. Plane 1206 is an example of plane 406, FIG. 4.

Figure 14:
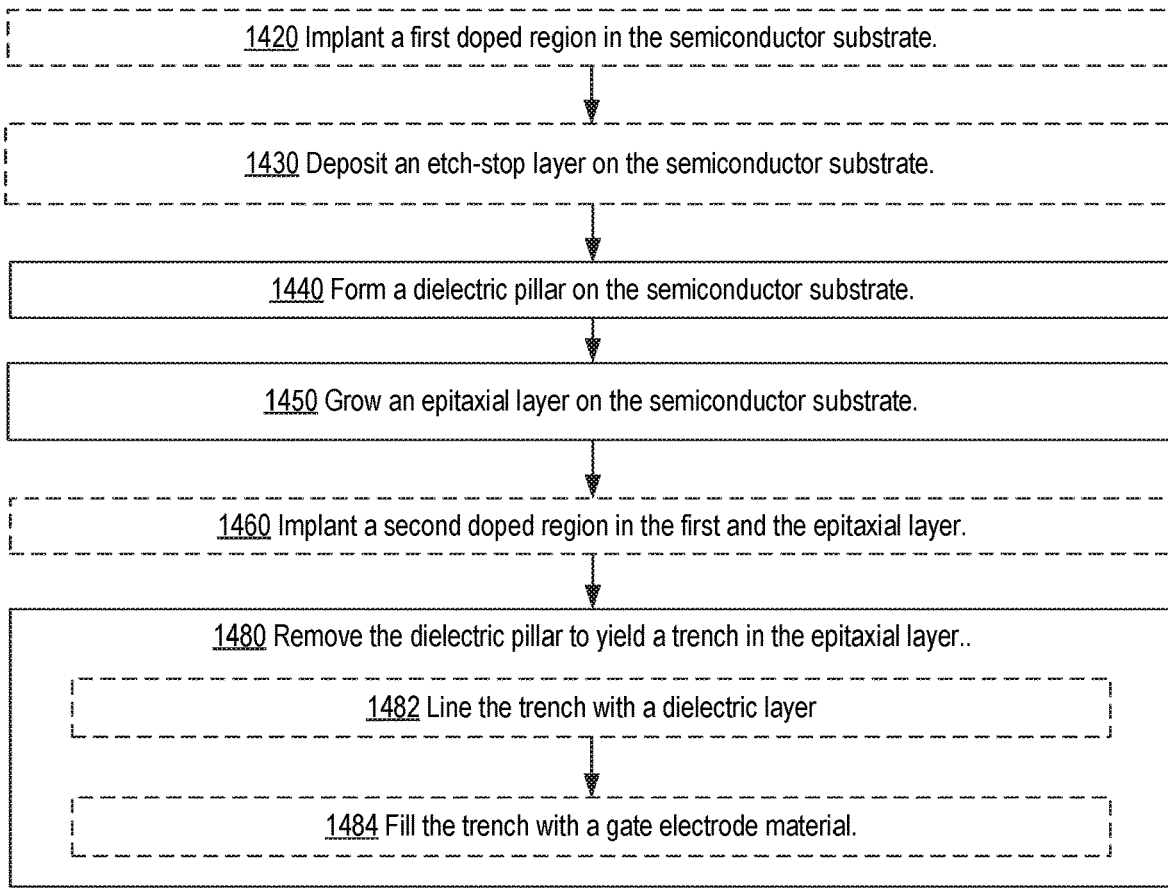
FIG. 14 is a flowchart illustrating a method for forming a vertical transfer gate, in an embodiment.

A distinguishing feature of a pixel 1200 fabricated via method 1400, discussed below with respect to FIG. 14, is its dopant concentration profile $\rho(z)$ along the z direction. Since implantation of photodiode section 541 occurs before epitaxial grown of epitaxial layer 830 is grown, dopant concentration profile $\rho(z)$ decreases abruptly at plane 1206, which is located at depth $z_T$ with respect to top surface 839 and depth $z_3$ with respect to bottom substrate surface 511. Plane 1206 corresponds to the surface plane where epitaxial layer 830 is grown or the interface between epitaxial layer 830 and semiconductor substrate 510. Depth $z_T$ equals thickness 836 of epitaxial layer 830. Dopant concentration profile $\rho(z)$ has a derivative $\rho'(z)=d\rho(z)/dz$ with respect to z. In embodiments, $\rho'(z)$ is discontinuous at depth $z_T$, which corresponds to depth $z_3$.

Figure 13:
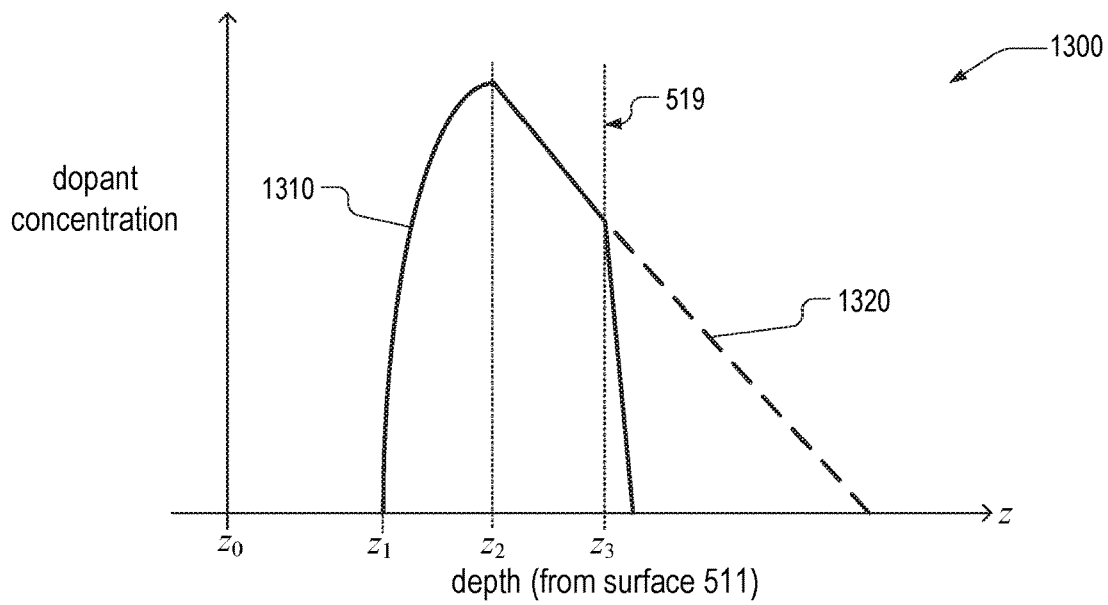
FIG. 13 is a schematic plot illustrating a dopant concentration as a function of depth, in an embodiment.

FIG. 13 is a schematic plot 1300 illustrating a dopant concentration 1310 as a function of depth relative to bottom substrate surface 511. Dopant concentration 1310 is an illustrative example of dopant concentration profile $\rho(z)$.

Plot 1300 denotes depths $z_1$, $z_2$, and $z_3$, relative to bottom substrate surface 511 where $z_3 > z_2 > z_1 > z_0$ and $z_0$ corresponds to bottom substrate surface 511. Semiconductor substrate 510 is located between $z_0$ and $z_3$, its top surface 519 being at depth $z_3$. Dopant concentration 1300 increases between depths $z_1$ and $z_2$ while decreasing between depths $z_2$ and $z_3$. For reasons described above in the description of dopant concentration profile $\rho(z)$, dopant concentration 1300 decreases abruptly at $z_3$. Plot 1300 illustrates, at depths exceeding $z_3$, a dopant concentration 1320 of a conventional pixel where, for example, the photodiode section is implanted between surfaces 418 and 411 of semiconductor substrate 410, FIG. 4, rather than from top surface 519, FIG. 5. At depth $z_3$, both dopant concentration 1320 and its derivative with respect to z are continuous with dopant concentration 1320 and its derivative respectively due the nature of implant profile in the same material layer.

FIG. 14 is a flowchart illustrating a method 1400 for forming a vertical transfer gate, such as vertical transfer gate 1280. Method 1400 includes steps 1440, 1450, and 1480. In embodiments, method 1400 also includes at least one of steps 1420, 1430, and 1460.

Step 1420 includes implanting a first doped region in the semiconductor substrate. The doped region may be formed of dopants having opposite conductivity to the semiconductor substrate. In an example of step 1420, photodiode section 541 is implanted, via an ion implantation process, at top substrate surface 519 of semiconductor substrate 510 when top surface 519 lacks any layers thereon, such as etch-stop layer 630, the dielectric layer from which pillar 740 was made, or epitaxial layer 830. A benefit of executing step 1420 is that the absence of additional layers enables photodiode section 541 to extend deeper into semiconductor substrate that is, away from the top surface 519, i.e., away from the oxide-silicon interface containing defects/trap sites inducing dark current. Further, a full-well capacity of the corresponding photodiode may be increased by increasing the volume of photodiode section 541. An additional benefit of step 1420 is that photodiode section 541 may be formed closer to bottom substrate surface 511, which enables more efficient detection of light (illumination) incident on bottom substrate surface 511.

Step 1430 includes depositing, on the semiconductor substrate, an etch-stop layer having a first etch selectivity that exceeds a second etch selectivity of the dielectric pillar. In an example of step 1430, etch-stop layer 630 is deposited on top surface 519, FIG. 6.

Step 1440 includes forming a dielectric pillar on a surface of the semiconductor substrate. For example, step 1440 may include depositing a dielectric material on the etch-stop layer to form a dielectric layer, patterning the dielectric layer with photoresist, followed by etching process to remove portions of dielectric layer and etch stop layer to form a dielectric pillar and stacked layers of remaining (non-etched) portions of dielectric layer and etch-stop layer. In an example of step 1440, pillar 740 is formed on top surface 519 of semiconductor substrate 510, FIG. 7. When method 1400 includes step 1430, pillar 740 is formed on etch-stop layer 730.

Step 1450 includes growing an epitaxial layer on the semiconductor substrate and surrounding the dielectric pillar. The dielectric pillar has a pillar height that exceeds an epitaxial-layer height of the epitaxial layer relative to a surface of the semiconductor substrate. In an example of step 1450, epitaxial layer 830 is epitaxially grown on semiconductor substrate 510, FIG. 8. Epitaxial layer 830 may be grown on semiconductor substrate 510 until its thickness 836 is less than height 746 by between twenty and fifty nanometers.

In embodiments, step 1450 is performed after step 1420, such that a pixel that results from method 1400 has dopant concentration 1310. Step 1440 may also be performed after 1420, as the presence of pillar 740 resulting from step 1440 may complicate the implantation of step 1420.

Step 1460 includes implanting a second doped region in the epitaxial layer and the semiconductor substrate. In an example of step 1460, doped region 945, FIG. 9, is implanted in epitaxial layers 830 and semiconductor substrate 510 via an ion implantation process.

Step 1480 includes removing the dielectric pillar. In embodiments, the dielectric pillar is removed via a wet etching process. In an example of step 1480, pillar 740 is removed from substrate assembly 900, FIG. 9, to yield trench 1034 of trenched substrate assembly 1000, FIG. 10. In embodiments, step 1480 yields a trench in the epitaxial layer. For example, removal of pillar 740 results in trench 1034 in epitaxial layer 830.

In embodiments, top surface 519 is the bottom surface of trench 1034. Photodiode section 541 is at a depth 1032 beneath top substrate surface 519. Depth 1032 is an example of depth 432, FIG. 4. Formation of trench 1034 via removal of pillar 740 means that control of depth 1032 does not depend on etch-depth tolerances associated with removing semiconductor material, e.g., of epitaxial layer 830. Instead, control of depth 1032 depends in part on etch-depth tolerances associated with removing pillar 740 and etch-stop layer 730. Since etch-stop layer 730 may be chosen to have a slow etch rate, the depth of trench 1034, and hence depth 1032, can be more precisely controlled than when a similar trench is formed by etching silicon.

Step 1480 may include at least one of steps 1482 and 1484. Step 1482 includes lining the trench with a dielectric layer. In an example of step 1482, trench 1034 is lined with dielectric layer 1150, FIG. 11.

Step 1484 includes filling the trench with a gate electrode material. In an example of step 1484, trench 1034 is filled with a material that constitutes gate-electrode 1225, such that step 1484 yields pixel 1200.

Combinations of Features

Features described above as well as those claimed below may be combined in various ways without departing from the scope hereof. The following enumerated examples illustrate some possible, non-limiting combinations:

(A1) A method for forming a transfer gate includes (i) forming a dielectric pillar on a surface of a semiconductor substrate and (ii) growing an epitaxial layer on the semiconductor substrate and surrounding the dielectric pillar. The dielectric pillar has a pillar height that exceeds an epitaxial-layer height of the epitaxial layer relative to the surface. The method also includes removing the dielectric pillar to yield a trench in the epitaxial layer. Forming the trench according to this method, rather than via RIE or RIS, yields a trench that lacks the aforementioned surface features that result in image artifacts.

(A2) Method (A1) may further include after removing the dielectric pillar, filling the trench with a conductive material.

(A3) Any method according to (A1) or (A2) may further include, after removing the dielectric pillar, lining the trench with a dielectric layer.

(A4) Any of methods (A1)-(A3) may further include, before growing the epitaxial layer, implanting a first doped region in the semiconductor substrate.

(A5) The method (A4) may further include implanting a second doped region in (i) the semiconductor substrate and (ii) the epitaxial layer adjacent to the trench.

(A6) In any method (A4) or (A5), removing the dielectric pillar to form the trench may include forming the trench that extends a depth $z_T$ with respect to a front surface of the semiconductor substrate along a direction z perpendicular to the front surface of the semiconductor substrate. The implanted first doped region and the second doped region have a dopant concentration profile. A derivative of dopant concentration profile with respect to direction z is discontinuous at depth $z_T$ (A7) In any of methods (A1)-(A6), forming the dielectric pillar may include forming a dielectric layer on the semiconductor substrate, patterning the dielectric layer, and etching the patterned dielectric layer to form the dielectric pillar.

(A8) In method (A7), forming the dielectric layer may include depositing a dielectric material on the semiconductor substrate until a thickness of the dielectric material is between 0.3 and 0.6 micrometers.

(A9) In any of methods (A7)-(A8), forming the dielectric pillar may further include, depositing an etch-stop layer on the semiconductor substrate before forming the dielectric layer.

(A10) In method (A9) forming the trench may include removing a region of the etch-stop layer between the dielectric pillar and the semiconductor substrate.

(A11) Any of methods (A9)-(A10) the etch stop layer having an etch rate less than an etch rate of the a dielectric layer.

(A12) In any of methods (A1)-(A11), the dielectric pillar having a pillar height, and growing the epitaxial layer may include epitaxially growing the epitaxial layer until the pillar height exceeds the epitaxial-layer height by between twenty and fifty nanometers.

(A13) In any of methods (A1)-(A12), forming the trench may include wet etching the dielectric pillar.

(B1) A pixel includes a doped semiconductor substrate. The doped semiconductor substrate has a front surface opposite a back surface. The front surface forms a trench extending a depth $z_T$ with respect to the front surface within the doped semiconductor substrate along a direction z perpendicular to the front surface and the back surface. The pixel has a dopant concentration profile, a derivative of the dopant concentration profile with respect to the direction z being discontinuous at the depth $z_T$.

(B2) The pixel (B1) may further include a gate-dielectric layer lining the trench and a conductive material filling the trench forming a gate electrode for a transistor.

(B3) In any pixel (B1) or (B2), the dopant concentration profile may be associated with a photodiode region of a photodiode formed in adjacent to the trench. The photodiode region is located at a distance from the front surface.

(B4) In any of pixels (B1)-(B3), the photodiode region may include a top photodiode section and a bottom photodiode section adjoining the top photodiode section. The bottom photodiode section is formed extending away from the front surface and configured to accumulate photogenerated charge of the photodiode in response to incident illumination. The bottom photodiode section may be disposed at a depth that is greater than the depth $z_T$.

(B5) In any of pixels (B1)-(B4), at least a portion of the gate electrode of the transistor may be formed on the front surface above the photodiode region.

(B6) Any of pixels (B1)-(B5), may further include a floating diffusion region disposed adjacent to the trench. The transistor is a transfer transistor coupled to the photodiode and the floating diffusion region and selectively transfer photogenerated charges from the photodiode in response to the incident illumination to the floating diffusion region.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A method for forming a transfer gate comprising:
    forming a dielectric pillar on a surface of a semiconductor substrate;
    after forming the dielectric pillar, growing an epitaxial layer on the semiconductor substrate to a height less than a pillar height of the dielectric pillar and surrounding the dielectric pillar, the dielectric pillar having a pillar height that exceeds an epitaxial-layer height of the epitaxial layer relative to the surface; and
    removing the dielectric pillar to yield a trench in the epitaxial layer.

2. The method of claim 1, further comprising, after removing the dielectric pillar, filling the trench with a conductive material.

3. The method of claim 2, further comprising, after removing the dielectric pillar, lining the trench with a gate-dielectric layer.

4. The method of claim 1, further comprising, before growing the epitaxial layer:
    implanting a first doped region in the semiconductor substrate.

5. The method of claim 4, removing the dielectric pillar to form the trench comprising:
    forming the trench that extends a depth $z_T$ with respect to a front surface of the semiconductor substrate along a direction z perpendicular to the front surface of the semiconductor substrate; wherein the implanted first doped region and the second doped region have a dopant concentration profile, a derivative of dopant concentration profile, with respect to the direction z being discontinuous at depth $z_T$.

6. The method of claim 1, forming the dielectric pillar comprising:
    forming a dielectric layer on the semiconductor substrate;
    patterning the dielectric layer; and
    etching the patterned dielectric layer to form the dielectric pillar.

7. The method of claim 6, forming the dielectric layer comprising depositing a dielectric material on the semiconductor substrate until a thickness of the dielectric material is between 0.3 and 0.6 micrometers.

8. The method of claim 6, forming the dielectric pillar further comprising:
    depositing an etch-stop layer on the semiconductor substrate before forming the dielectric layer.

9. The method of claim 8, forming the trench comprising removing a region of the etch-stop layer between the dielectric pillar and the semiconductor substrate.

10. The method of claim 8, the etch stop layer having an etch rate less than an etch rate of the dielectric layer.

11. The method of claim 1, the dielectric pillar having a pillar height, and growing the epitaxial layer comprising:
   epitaxially growing the epitaxial layer until the pillar height exceeds the epitaxial-layer height by between twenty and fifty nanometers.

12. The method of claim 1, forming the trench comprising wet etching the dielectric pillar.

13. A method for forming a transfer gate comprising:
   forming a dielectric pillar on a surface of a semiconductor substrate;
   implanting a first doped region in the semiconductor substrate;
   implanting a second doped region in (i) the semiconductor substrate and (ii) the epitaxial layer adjacent to the trench;
   after forming the dielectric pillar, growing an epitaxial layer on the semiconductor substrate and surrounding the dielectric pillar, the dielectric pillar having a pillar height that exceeds an epitaxial-layer height of the epitaxial layer relative to the surface; and
   removing the dielectric pillar to yield a trench in the epitaxial layer.

14. The method of claim 13, wherein the second doped region extends toward and adjoins the first doped region in the semiconductor substrate.

* * * * *